United States Patent
Liu

(10) Patent No.: US 10,128,862 B2
(45) Date of Patent: Nov. 13, 2018

(54) SUCCESSIVE APPROXIMATION REGISTER ANALOG-TO-DIGITAL CONVERTER APPLYING CALIBRATION CIRCUIT, ASSOCIATED CALIBRATING METHOD, AND ASSOCIATED ELECTRONIC DEVICE

(71) Applicant: MEDIATEK INC., Hsin-Chu (TW)

(72) Inventor: Chun-Cheng Liu, Changhua County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/401,106

(22) Filed: Jan. 9, 2017

(65) Prior Publication Data

US 2017/0214411 A1    Jul. 27, 2017

Related U.S. Application Data

(60) Provisional application No. 62/281,202, filed on Jan. 21, 2016.

(51) Int. Cl.
| | | |
|---|---|---|
| *H03M 1/34* | (2006.01) | |
| *H03M 1/10* | (2006.01) | |
| *H03M 1/00* | (2006.01) | |
| *H03M 1/38* | (2006.01) | |
| *H03M 1/06* | (2006.01) | |
| *H03M 1/16* | (2006.01) | |
| *H03M 1/46* | (2006.01) | |

(52) U.S. Cl.
CPC ......... *H03M 1/1009* (2013.01); *H03M 1/001* (2013.01); *H03M 1/1042* (2013.01); *H03M 1/0692* (2013.01); *H03M 1/164* (2013.01); *H03M 1/38* (2013.01); *H03M 1/468* (2013.01)

(58) Field of Classification Search
CPC .............................. H03M 1/009; H03M 1/001
USPC .................................. 341/118, 120, 155, 163
See application file for complete search history.

(56) References Cited

U.S. PATENT DOCUMENTS

| | | | | |
|---|---|---|---|---|
| 8,878,568 B1* | 11/2014 | Farzan | ............. | H03K 19/00384 |
| | | | | 326/26 |
| 9,172,384 B1* | 10/2015 | Liu | ......................... | H03L 7/087 |
| 9,246,552 B2* | 1/2016 | Agrawal | ............... | H02M 7/217 |
| 9,264,058 B1* | 2/2016 | Tai | ...................... | H03M 1/1009 |
| 9,496,884 B1* | 11/2016 | Azenkot | ............. | H03M 1/1023 |

(Continued)

OTHER PUBLICATIONS

Huang, A 1-uW 10-bit 200-kS/s SAR ADC With a Bypass Window for Biomedical Applications, IEEE Journal of Solid-State Circuits, vol. 47, No. 11, Nov. 2012.

(Continued)

*Primary Examiner* — Peguy Jean Pierre
(74) *Attorney, Agent, or Firm* — Winston Hsu

(57) ABSTRACT

A Successive Approximation Register (SAR) Analog-to-Digital Converter (ADC) including: a comparing module and a calibration circuit. The comparing module is arranged to generate a first comparison result by comparing an input voltage value of the SAR ADC with a first voltage value and a second result by comparing the input voltage value with a second voltage value; the calibration circuit coupled to the comparing module is for generating a determination result determining whether the input voltage value is in a range according to the first comparison result and the second comparison result, and enters a calibration mode according to the determination result.

22 Claims, 5 Drawing Sheets

(56) References Cited

U.S. PATENT DOCUMENTS

2013/0102264 A1* 4/2013 Nakane ............... H03M 1/1004
                                                                455/130
2015/0002321 A1* 1/2015 Zhou ................... H03M 1/0617
                                                                341/118

OTHER PUBLICATIONS

Zhou, A 12 bit 160 MS/s Two-Step SAR ADC With Background Bit-Weight Calibration Using a Time-Domain Proximity Detector, IEEE Journal of Solid-State Circuits, vol. 50, No. 4, Apr. 2015.
Lee, A 12b 70MS/s SAR ADC with Digital Startup Calibration in 14nm CMOS, 2015 Symposium on VLSI Circuits Digest of Technical Papers.
Tseng, A 12-bit 104-MS/s SAR ADC in 28nm CMOS for Digitally-Assisted Wireless Transmitters, IEEE Asian Solid-State Circuits Conference, Nov. 2015.
Ming Ding et al., 26.2 A 5.5fJ/conv-step 6.4MS/s 13b SAR ADC Utilizing a Redundancy-Facilitated Background Error-Detection-and-Correction Scheme, ISSCC 2015 / Session 26 / Nyquist-Rate Converters / 26.2, Feb. 25, 2015, 2015 IEEE International Solid-State Circuits Conference, XP032748217, IEEE, pp. 460-461 & Fig. 26.2.7.

* cited by examiner

US 10,128,862 B2

SUCCESSIVE APPROXIMATION REGISTER ANALOG-TO-DIGITAL CONVERTER APPLYING CALIBRATION CIRCUIT, ASSOCIATED CALIBRATING METHOD, AND ASSOCIATED ELECTRONIC DEVICE

CROSS REFERENCE TO RELATED APPLICATIONS

This application claims the benefit of U.S. provisional application No. 62/281,202 filed on Jan. 21, 2016 and incorporated herein by reference.

BACKGROUND

In advanced integrated circuit (IC) processes, passive elements (more particularly, capacitors) are very likely to have mismatches when the capacitors are not small. This results in poor performance (e.g. poor resolution) for circuitries which require fine accuracy, especially for analog-to-digital converters (ADC) comprising capacitor-based digital-to-analog converters (DAC) such as a successive approximation register (SAR) ADC. Therefore, a calibration mechanism for an ADC which can calibrate the mismatch caused by capacitor to achieve high resolution is extremely desirable in the art.

SUMMARY

One of the objectives of the present invention is to provide a calibrating method for an SAR ADC, and an associated device, to solve the abovementioned problem.

According to an embodiment of the present invention, a Successive Approximation Register (SAR) Analog-to-Digital Converter (ADC) is disclosed, comprising: a comparing module, and a calibration circuit. The comparing module is arranged to generate a first comparison result by comparing an input voltage value of the SAR ADC with a first voltage value and a second result by comparing the input voltage value with a second voltage value; the calibration circuit coupled to the comparing module is for generating a determination result determining whether the input voltage value is in a range according to the first comparison result and the second comparison result, and enters a calibration mode according to the determination result.

According to an embodiment of the present invention, a calibrating method of a SAR ADC is disclosed, comprising: determining whether the SAR ADC enters into a calibration mode with reference to whether an input voltage value of the SAR ADC is in a predetermined range; generating an n-bit output signal, wherein n is a positive integer; and performing a weighted number calibration for each of at least one bit of the n-bit output signal when the input voltage value of the SAR ADC is in the predetermined range, wherein each of the at least one bit of the n-bit output signal corresponds to a weighted number; wherein the weighted number calibration for each of the at least one bit of the n-bit output signal comprises: adjusting a weighted number corresponding to the bit.

According to an embodiment of the present invention, an electronic device for calibrating a SAR ADC is disclosed, comprising: a storage device and a processor. The storage device is arranged to store a program code, and the processor is arranged to execute the program code, wherein when loaded and executed by the processor, the program code instructs the processor to execute the following steps: determining whether the SAR ADC enters into a calibration mode with reference to whether an input voltage value of the SAR ADC is in a predetermined range; generating an n-bit output signal, wherein n is a positive integer; and performing a weighted number calibration for each of at least one bit of the n-bit output signal when the input voltage value of the SAR ADC is in the predetermined range, wherein each of the at least one bit of the n-bit output signal corresponds to a weighted number; wherein the weighted number calibration for each of the at least one bit of the n-bit output signal comprises: adjusting a weighted number corresponding to the bit.

According to an embodiment of the present invention, a calibrating method of a SAR ADC, comprising: determining whether the SAR ADC enters into a calibration mode with reference to whether an input voltage value of the SAR ADC is in a predetermined range; generating an n-bit output signal, wherein n is a positive integer; and repeatedly performing a weighted number calibration for an $n^{th}$ bit of the n-bit output signal, wherein each bit of the output signal corresponds to a weighted number, and the $n^{th}$ bit is a most significant bit of the n-bit output signal; wherein the weighted number calibration for the $n^{th}$ bit of the n-bit output signal of the SAR logic circuit comprises: adjusting a weighted number corresponding to the $n^{th}$ bit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
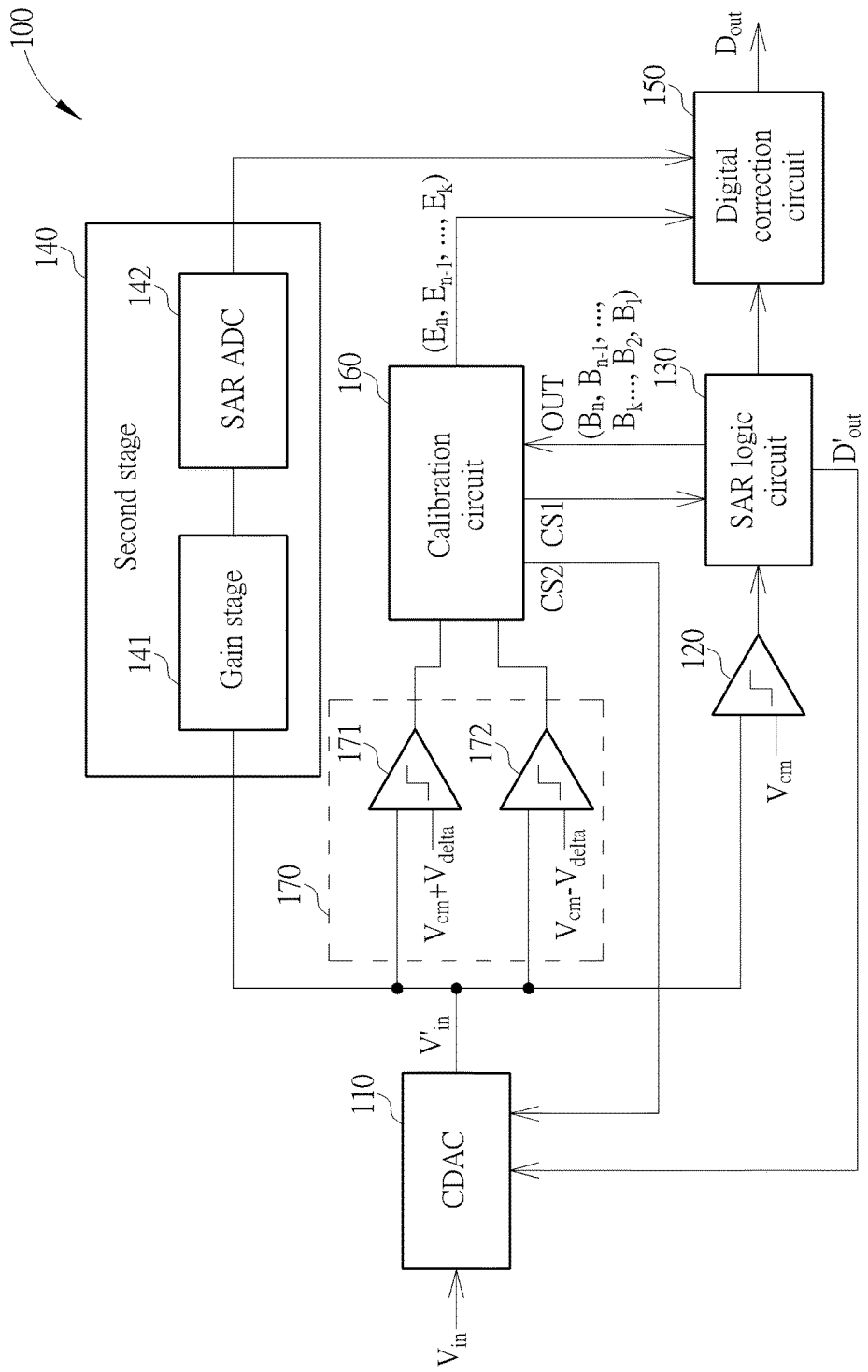
FIG. 1 is a diagram illustrating an SAR ADC according to an embodiment of the present invention.

FIG. 1 is a diagram illustrating an n-bit successive approximation register (SAR) analog-to-digital converter (ADC) 100 according to an embodiment of the present invention, wherein n is a positive integer. The SAR ADC 100 disclosed by the present invention has a calibration mechanism implemented by a calibration circuit 160 comprised therein. As shown in FIG. 1, the SAR ADC 100 comprises a capacitor-based digital-to-analog converter (DAC) 110, a comparator 120, a SAR logic circuit 130, a second stage 140 comprising a gain stage 141 and a SAR ADC 142, a digital correction circuit 150, the calibration circuit 160 and a comparing module 170 including comparators 171 and 172. The capacitor-based DAC 110 can be any form of DAC. In one embodiment, the capacitor-based DAC 110 includes a capacitor array. The capacitor-based DAC 110 receives an input voltage $V_{in}$ and generates a sampled input voltage $V_{in}'$. The comparing module 170 is coupled to the capacitor-based DAC 110 and determines whether the SAR ADC 100 enters into a calibration mode according to the sampled input voltage $V_{in}'$. More specifically, the comparator 171 comprised in the comparing module 170 compares the sampled input voltage $V_{in}'$ with a common voltage $V_{cm}$ plus a voltage difference $V_{delta}$ ($V_{com}+V_{delta}$) to generate a first comparison result. The comparator 172 comprised in the comparing module 170 compares the sampled input voltage $V_{in}'$ with a common voltage $V_{cm}$ minus a voltage difference $V_{delta}$ ($V_{com}-V_{delta}$) to generate a second comparison result. The first and second comparison results are used by the calibration circuit 160 to generate a determination result $V_{det}$ which determines whether the sampled input voltage $V_{in}'$ locates in a voltage range determined by $V_{com}+V_{delta}$ and $V_{com}-V_{delta}$. In one embodiment, the first and second comparison results and the determination result $V_{det}$ are logic values.

When the determined result $V_{det}$ indicates that the sampled input voltage $V_{in}'$ does not locate in the voltage range determined by $V_{com}+V_{delta}$ and $V_{com}-V_{delta}$, the n-bit SAR ADC 100 stays in a normal mode. The comparator 120 compares the sampled input voltage $V_{in}'$ with the common voltage $V_{cm}$ to generates a comparison result. The SAR logic circuit 130 generates the output signal OUT according to the comparison result. Then, the digital correction circuit 150 generates the digital output $D_{out}$ according to the output signal OUT.

When the determined result $V_{det}$ indicates that the sampled input voltage $V_{in}'$ locates in a voltage range determined by $V_{com}+V_{delta}$ and $V_{com}-V_{delta}$, the n-bit SAR ADC 100 enter into the calibration mode. In one embodiment, the voltage difference $V_{delta}$ can be 10 millivolts. The detailed calibration flow will be discussed in the following paragraph. In other embodiments, the comparing module 170 can be implemented by hardware, software or firmware as long as the goal can be achieved. These alterative designs shall fall within the scope of the present invention.

In one embodiment, the determination result $V_{det}$ is a logic value.

Figure 2:
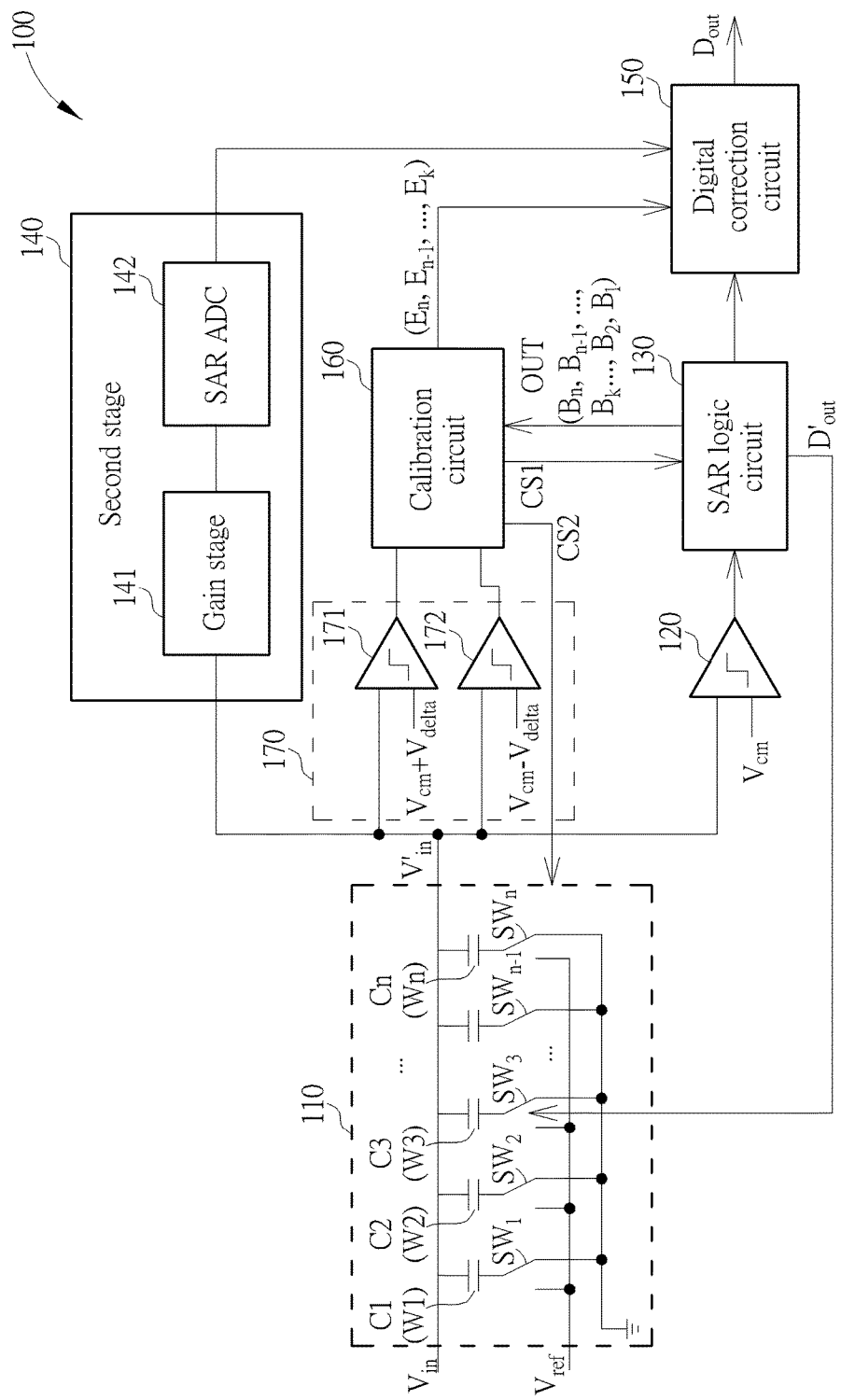
FIG. 2 is a diagram illustrating a capacitor-based DAC according to an embodiment of the present invention.

FIG. 2 is a diagram illustrating the capacitor-based DAC 110 according to an embodiment of the present invention, wherein the SAR ADC 100 shown in FIG. 2 is a comprehensive implementation can be used to implement the SAR ADC 100 shown in FIG. 1. As shown in FIG. 2, the capacitor-based DAC 110 comprises a plurality of capacitors C1-Cn. The capacitance of the plurality of capacitors C1-Cn represents weighted numbers W1-Wn corresponding to n bits of an output signal OUT of the SAR logic circuit 130, i.e. $B_nB_{n-1}B_{n-1} \ldots B_k \ldots B_2B_1$, wherein $B_n$ is a most significant bit (MSB) of the output signal OUT and $B_1$ is a least significant bit (LSB) of the output signal OUT. The capacitor-based DAC 110 further comprises a plurality of switches SW1-SWn corresponding to the plurality of capacitor C1-Cn respectively, wherein each switch has one terminal coupled to the corresponding capacitor and another terminal coupled to a reference voltage $V_{ref}$ as shown in FIG. 2. The plurality of switches SW1-SWn are controlled by at least an output $D'_{out}$ of the SAR logic circuit 130 to determine each switch should be opened or closed. It should be noted that, however, the arrangement of the plurality of capacitors comprised in the capacitor-based DAC 110 and the connection between capacitors, switches, and the reference voltage $V_{ref}$ is only for illustrative purposes, and not a limitation of the present invention. Those skilled in the art should readily understand there are other implementable arrangements of the capacitors and the operation of the capacitor-based DAC 110 for an SAR ADC.

In the calibration mode, the calibration circuit 160 receives the output signal OUT generated by the SAR logic circuit 130 and generate control signals CS1 and CS2 to the SAR logic circuit 130 and the CDAC 110, respectively, and is further arranged to generate a plurality of calibrating values $E_n, E_{n-1}, \ldots, E_k$ to the digital correction circuit 150 for calibration, where k is a positive integer smaller than n. The control signals CS1 and CS2 are used to determine which bit/bits of the n bits is/are to be calibrated.

Figure 3:
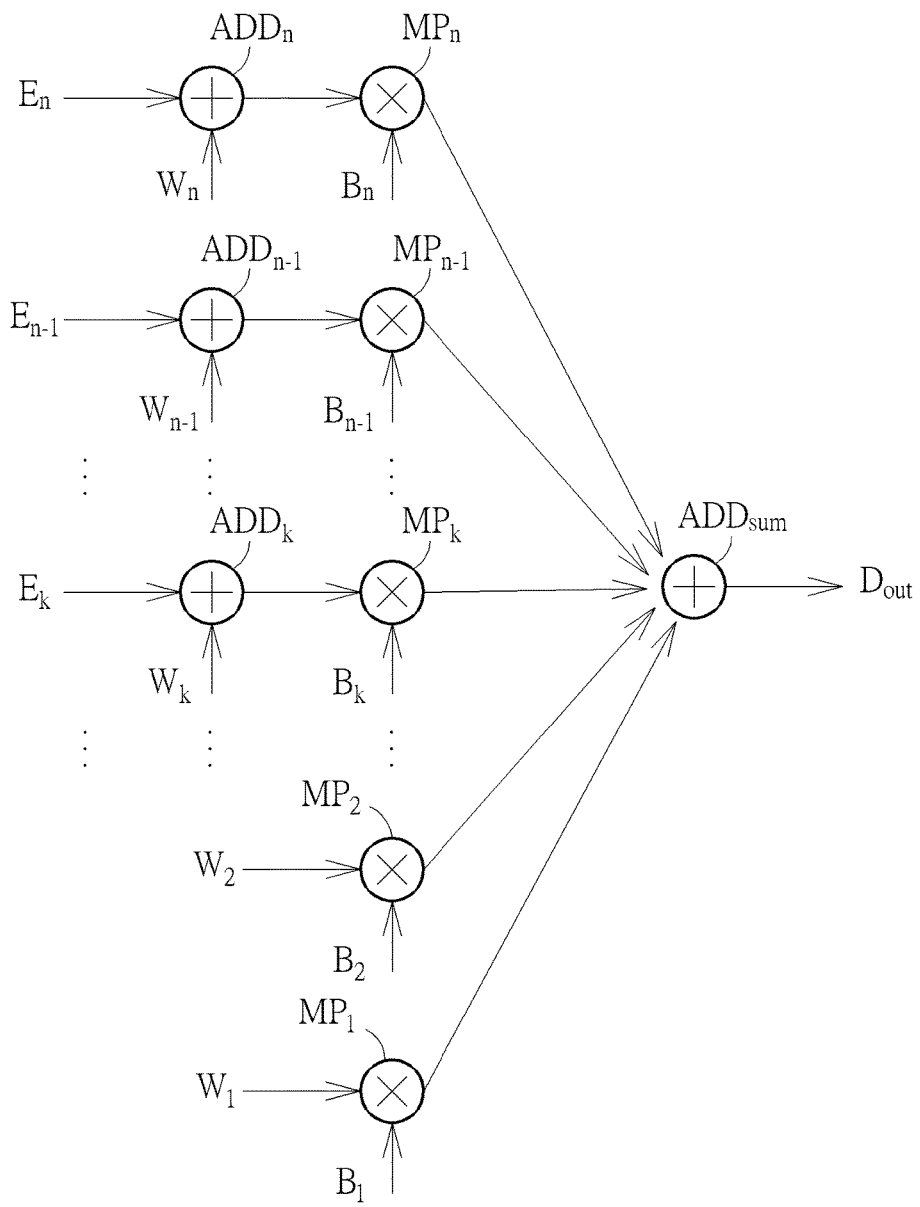
FIG. 3 is a diagram illustrating a digital correction circuit according to an embodiment of the present invention.

FIG. 3 is a diagram illustrating the operation of the digital correction circuit 150. As shown in FIG. 3, in the calibration mode, the plurality of calibrating values $E_n, E_k$ respectively correspond to the bits $B_n, B_k$ and indicate error terms of the bits $B_n, B_{n-1}, \ldots, B_k$. The calibrating values $E_n, E_{n-1}, \ldots, E_k$ are generated by the calibration circuit 160 and received by a plurality of adders $ADD_n, ADD_{n-1}, \ldots, ADD_k$ of the digital correction circuit 150 to combine with the weighted numbers $W_n, W_{n-1}, \ldots, W_k$ for calibrating the weighted numbers $W_n, W_{n-1}, \ldots, W_k$, respectively. It should be noted that k can be any integer from 1 to n, depending on the number of bits to be calibrated. For example, in a 12-bit (i.e. n=12) SAR ADC, k can be 8 for calibrating 5 bits (i.e. $B_{12}B_{11}B_{10}B_9B_8$) of the SAR ADC. The aforementioned example is not a limitation to the present invention. When k=n, only one bit, i.e. the MSB of the output signal OUT, needs calibration. Each of the plurality of calibrating values $En, E_{n-1}, \ldots, E_k$ can be either a positive value or a negative value, depending on the calibrating result of the calibration circuit 160 which will be described in FIG. 4. After the weighted numbers are updated (combining the calibrating values $E_n, E_{n-1}, \ldots, E_k$ with the weighted numbers $W_n, W_{n-1}, \ldots, W_k$ by the plurality of adders $ADD_n, ADD_{n-1}, \ldots, ADD_k$), the results are received by a plurality of multipliers $MP_n, MP_{n-1}, \ldots, MP_k$ of the digital correction circuit 150 to multiply the corresponding bits $B_n, B_{n-1}, \ldots, B_k$. For those non-calibrated bits (i.e. $B_{k-1}B_{k-2} \ldots B_1$), the corresponding weighted numbers $W_{k-1}W_{k-2} \ldots W_1$ are directly received by the multipliers $MP_{k-1}, MP_{k-2}, \ldots, MP_1$ of the digital correction circuit 150 to multiply the bits $B_{k-1}B_{k-2} \ldots B_1$ as shown in FIG. 3. Further, the multiplied results are received by an adder $ADD_{sum}$ of the digital correction circuit 150 to generate a digital output $D_{out}$ by calculating a weighted summation from the updated weighted numbers ($W_1$-$W_n$) and the corresponding n bits ($B_1$-$B_n$) as shown in FIG. 3. Those calculation executed by the digital correction circuit 150 are not limited to be executed by hardware. In other embodiments, the calculation can be executed by hardware, software or firmware. These alternative designs shall fall within the scope of the present invention as long as the goal can be achieved.

The other elements (e.g. the comparator 120 and the second stage 140) included in the SAR ADC 100 should be well-known by those skilled in the art. For example, to achieve a better Signal to Noise Ratio (SNR) of the SAR ADC 100, the second stage 140 comprising the gain stage 141 and the SAR ADC 142 is arranged to amplify the residue of the sampled input voltage $V_{in}'$ after obtaining the MSB bit $B_n$ of the output signal OUT. As this invention highlights the calibration mechanism, the detailed description of those elements is omitted here for brevity. The calibrating method of the calibration circuit 160 will be discussed in the following paragraphs.

Figure 4:
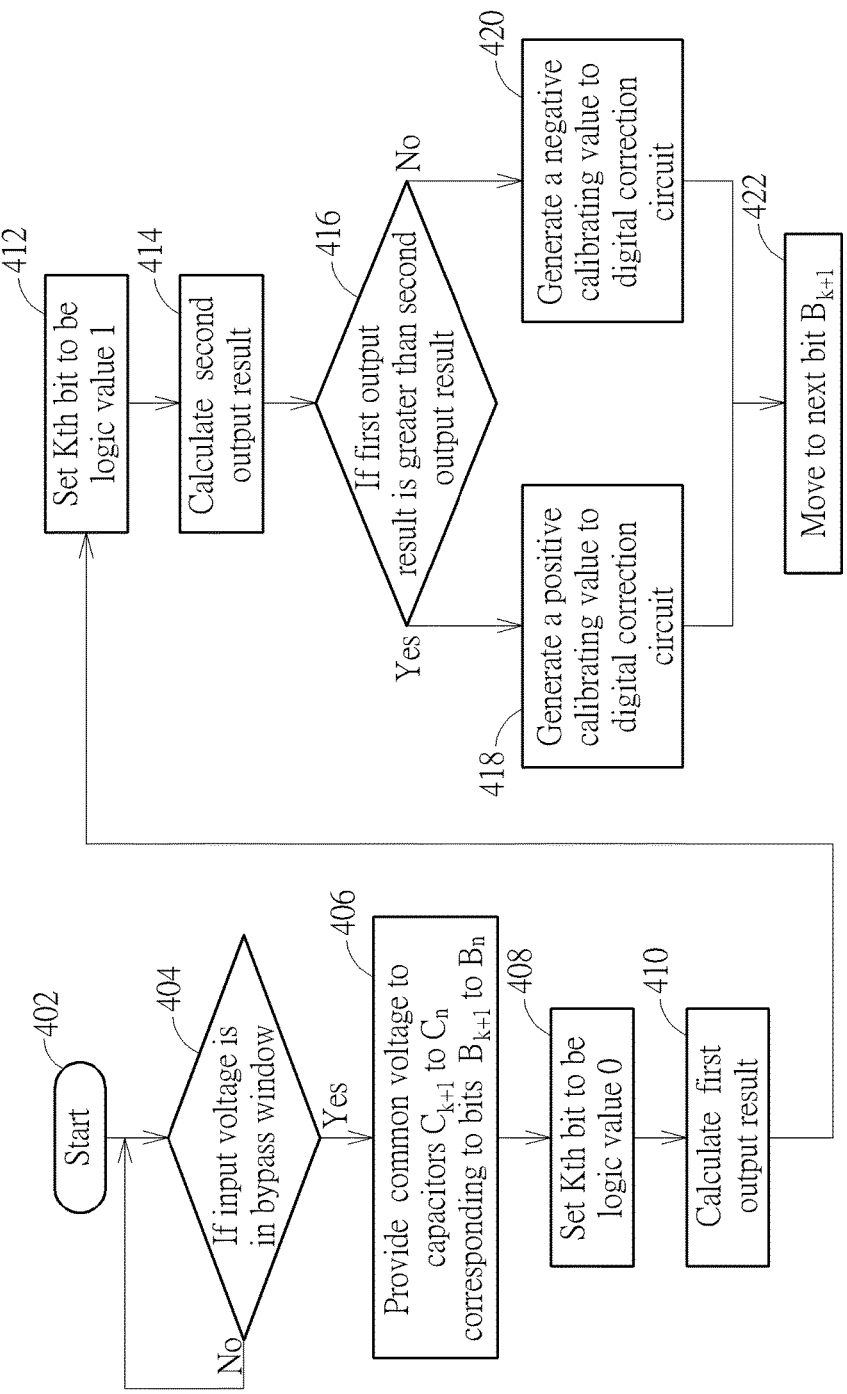
FIG. 4 is a flowchart illustrating a calibrating method for the SAR ADC shown in FIG. 1 according to an embodiment of the present invention.

The calibrating method using the calibration circuit 160 starts from the bits $B_k$, $B_{k+1}$, ..., to $B_n$ (the MSB) of the output signal OUT then back to the bit $B_k$, and so on, to form a background calibration loop. The operation for calibrating each bit will be described in FIG. 4. Please refer to FIG. 4 in conjunction with FIG. 3. FIG. 4 is a flowchart illustrating a calibrating method 400 for the SAR ADC according to an embodiment of the present invention. The calibrating method using the calibration circuit 160 is applicable to each bit from the bits $B_k$ to $B_n$ of the output signal OUT, and the calibrating method 400 shown in FIG. 4 illustrates the bit $B_k$ as an example. The steps of the method are not limited to the same order as shown in FIG. 4. The exemplary calibrating method may be briefly summarized by the following steps.

Step 402: start.

Step 404: determine if the sampled input voltage is in a voltage range. If yes, go to step 406; otherwise go to step 404.

In step 404, the calibration circuit 160 detects if an sampled input voltage $V_{in}'$ of the SAR ADC 100 is in a voltage range which is formed by a predetermined voltage range. In this embodiment, the predetermined voltage range can be defined as from −10 millivolt to +10 millivolt. In one embodiment, the sampled input voltage $V_{in}'$ is coupled to two comparators to determine whether the sampled input voltage $V_{in}'$ is in the voltage range.

Step 406: provide common voltage to capacitors $C_{k+1}$ to $C_n$ corresponding to bits $B_{k+1}$ to $B_n$.

In step 406, the switches $SW_{k+1}$ to SWn corresponding to the capacitors $C_{k+1}$ to $C_n$ are controlled by the control signal CS2 to connect to a common voltage to hold still without being switched, such that the capacitors $C_{k+1}$ to $C_n$ maintain their charges, wherein the control signal CS2 is generated by the calibration circuit 160.

Step 408: set the bit $B_k$ to be logic value 0.

In step 408, the calibration circuit 160 sends the control signal CS1 to the SAR logic circuit 130 to set the bit $B_k$ of the output signal OUT to be a logic value 0 in order to obtain the updated output signal OUT.

Step 410: calculate a first output result.

In step 410, the calibration circuit 160 calculates a first output result OS1 after the bit $B_k$ is set to be the logic value 0 by summing the weighted summation of the updated output signal OUT of the SAR logic circuit for a predetermined number of times. The detail is described in the following example.

Assuming k=5, the ideal weighted numbers will be $W_5$=7, $W_4$=4, $W_3$=2, $W_2$=1, $W_1$=1 while the capacitors corresponding to the bits $B_5$, $B_4$, $B_3$, $B_2$, $B_1$ will be $C_5$=8 C, $C_4$=4 C, $C_3$=2 C, $C_2$=1 C, $C_1$=1 C, wherein the capacitor C5 has mismatch. Assume the predetermined number of times is 4 and ignore the bits $B_6$ to $B_n$ in the following example. The four updated output signals $OUT_1$, $OUT_2$, $OUT_3$, and $OUT_4$ obtained after setting the bit $B_5$ to be logic value 0 may be $OUT_1$=[$B_5$ $B_4$ $B_3$ $B_2$ $B_1$]=[01111], $OUT_2$=[$B_5$ $B_4$ $B_3$ $B_2$ $B_1$]=[01111], $OUT_3$=[$B_5$ $B_4$ $B_3$ $B_2$ $B_1$]=[01110], $OUT_4$=[$B_5$ $B_4$ $B_3$ $B_2$ $B_1$]=[01111]. Ideally, the output signal OUT should be [01111] all the time. Next, the weighted summations $WS_1$, $WS_2$, $WS_3$, and $WS_4$ of the update output signals $OUT_1$, $OUT_2$, $OUT_3$, and $OUT_4$ are calculated. The weighted summations of the update output signals $OUT_1$, $OUT_2$, $OUT_3$, and $OUT_4$ will be $WS_1$=8, $WS_2$=8, $WS_3$=7, and $WS_4$=8. Therefore, the first output result will be the sum of the weighted summations $WS_1$, $WS_2$, $WS_3$, and $WS_4$; hence, the first output result OS1=8+8+7+8=31. It should be noted that the predetermined number of times is determined based on designer's consideration, not a limitation of the present invention. In other embodiments, the predetermined number of times can be any positive integer, depending on the actual design considerations.

Step 412: set the bit $B_k$ to be a logic value 1.

In step 408, the calibration circuit 160 sends the control signal CS1 to the SAR logic circuit 130 to set the bit $B_k$ of the output signal OUT to be the logic value 1 in order to obtain the updated output signal OUT.

Step 414: calculate second output result.

In step 414, the calibration circuit 160 calculates a second output result OS2 after the bit $B_k$ is set to be a logic value 1 by summing the weighted summation of the updated output signal OUT of the SAR logic circuit for the predetermined number of times.

Following the above example, the four updated output signals $OUT_1$, $OUT_2$, $OUT_3$, and $OUT_4$ obtained after setting the bit $B_5$ to be the logic value 1 may be $OUT_1$=[$B_5$ $B_4$ $B_3$ $B_2$ $B_1$]=[10000], $OUT_2$=[$B_5$ $B_4$ $B_3$ $B_2$ $B_1$]=[10001], $OUT_3$=[$B_5$ $B_4$ $B_3$ $B_2$ $B_1$]=[10000], $OUT_4$=[$B_5$ $B_4$ $B_3$ $B_2$ $B_1$]=[10000]. Ideally, the output signal OUT should be [10000] all the time. Next, the weighted summations $WS_1$, $WS_2$, $WS_3$, and $WS_4$ of the update output signals OUT1, $OUT_2$, $OUT_3$, and $OUT_4$ are calculated. The weighted summations of the update output signals OUT1, $OUT_2$, $OUT_3$, and $OUT_4$ will be $WS_1$=7, $WS_2$=8, $WS_3$=7, and $WS_4$=7. Therefore, the second output result will be the sum of the weighted summations $WS_1$, $WS_2$, $WS_3$, and $WS_4$; hence, the second output result OS2=7+8+7+7=29.

Step 416: determine if first output result is greater than second output result. If yes, go to step 418; otherwise, go to step 420.

In step 416, the calibration circuit 160 determines if the first output result OS1 is greater than the second output result OS2. If the first output result OS1 is greater than the second output result, the weighted number $W_k$ is too small and needs a positive calibrating value for calibration. If the first output result OS1 is not greater than the second output result, the weighted number $W_5$ is too big and needs a negative calibrating value for calibration.

Step 418: generate a positive calibrating value to digital correction circuit.

In step 418, the calibration circuit 160 determines the first output result OS1 is greater than the second output result OS2. Hence, the weighted number $W_k$ is too small and needs a positive calibrating value for calibration. The calibration circuit 160 generates a calibrating value $E_k$ corresponding to the weighted number $W_k$ to the digital correction circuit 150, i.e. the digital correction circuit 150 adds the calibrating value $E_k$ to the weighted number $W_k$ (i.e. $W_k$=$W_k$+$E_k$). It should be noted that the calibrating value $E_k$ can be a quarter of the LSB value or one eighth of the LSB value; this is not a limitation of the present invention.

Step 420: generate a negative calibrating value to digital correction circuit.

In step 420, the calibration circuit 160 determines the first output result OS1 is not greater than the second output result OS2. Hence, the weighted number $W_k$ is too big and needs a negative calibrating value for calibration. The calibration circuit 160 generates a calibrating value $E_k$ corresponding to the weighted number $W_k$ to the digital correction circuit 150, i.e. the digital correction circuit 150 subtracts the calibrating value $E_k$ from the weighted number $W_k$ (i.e. $W_k$=$W_k$−$E_k$).

Step 422: move to next bit $B_{k+1}$.

After the calibration of the weighted number $W_k$ corresponding to the bit $B_k$ is finished, the calibration circuit 160 moves the calibration flow to the next bit, i.e. the bit $B_{k+1}$ in this embodiment.

By repeating the calibrating method described above, the error of the weighted number caused by the mismatch of the capacitor can be deduced. It should be noted that the calibrating method disclosed above not only can calibrate the mismatch of the capacitor, but also can calibrate the error of the gain stage 141 of the second stage 140 of the SAR ADC 100. Furthermore, the calibrating method 400 can be applied in a SAR ADC, a pipelined SAR ADC, or other CDAC based ADCs; this is not a limitation of the present invention.

Figure 5:
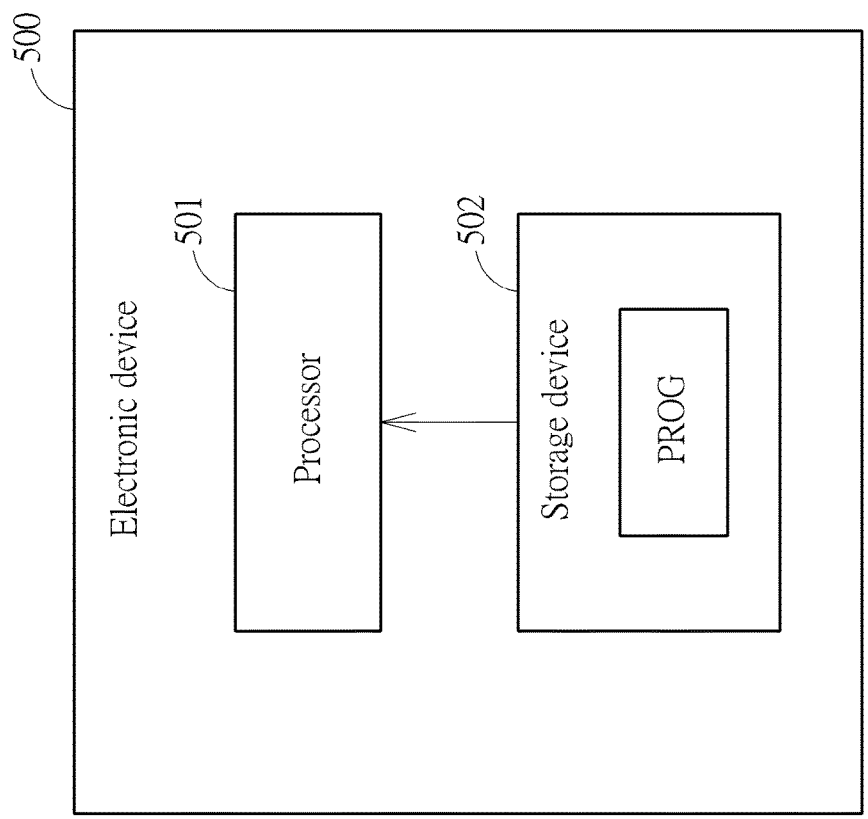
FIG. 5 is a diagram illustrating an electronic device according to an embodiment of the present invention.

FIG. 5 is a diagram illustrating an electronic device 500 for performing the aforementioned calibration circuit 160 according to an embodiment of the present invention. The electronic device 500 comprises a processor 501 and a storage device storing a program code PROG. When the program code PROG is loaded and executed by the processor 501, the calibrating flow shown in FIG. 4 is executed. The person skilled in the art should readily understand the operation of the processor 510 after reading the above paragraphs. The detailed description is therefore omitted here for brevity.

Briefly summarized, the present invention discloses a calibrating method for calibrating the error of a weighted number caused by mismatch of the capacitor. Utilizing the calibrating method disclosed by the present invention, the calibration convergence time is very short, and the hardware overhead for the ADC applying this calibrating method is very small.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A successive approximation register (SAR) analog-to-digital converter (ADC) comprising:
a comparing module, arranged to generate a first comparison result by comparing an input voltage value of the SAR ADC with a first voltage value and a second result by comparing the input voltage value with a second voltage value;
a calibration circuit, coupled to the comparing module, for generating a determination result determining whether the input voltage value is in a range according to the first comparison result and the second comparison result, and enters a calibration mode according to the determination result;
wherein when the determination result indicates that the input voltage value is between the first voltage value and the second voltage value, the calibration circuit enters the calibration mode to perform a weighted number calibration; and when the determination result indicates that the input voltage value is not between the first voltage value and the second voltage value, the calibration circuit stays in a normal mode and not perform a weighted number calibration.

2. The SAR ADC of claim 1, comprising:
a SAR logic circuit, arranged to generate an n-bit output signal, wherein n is a positive integer;
wherein the calibration circuit performs the weighted number calibration for at least one bit of the n-bit output signal of the SAR logic circuit according to the determination result.

3. The SAR ADC of claim 2, wherein each of the at least one bit of the n-bit output signal corresponds to a weighted number.

4. The SAR ADC of claim 3, wherein the calibration circuit sequentially and repeatedly performing the weighted number calibration for each of the at least one bit of the n-bit output signal, the $n^{th}$ bit is a most significant bit of the output signal.

5. The SAR ADC of claim 3, wherein the calibration circuit performs the weighted number calibration to generate at least one calibrating value, and the SAR ADC further comprises:
a digital correction circuit, coupled to the calibration circuit, configured to adjust the weighted number by using the calibrating value to generate an adjusted weighted number, and generate a digital output according to the adjusted weighted number and the n-bit output signal of the SAR logic circuit.

6. The SAR ADC of claim 2, wherein the calibration circuit adjusts the weighted number corresponding to the bit comprises:
setting the bit of the output signal of the SAR logic circuit to be a first logic value in order to generate a first output result;
setting the bit of the output signal of the SAR logic circuit to be a second logic value different from the first logic value in order to generate a second output result, wherein each of the first output result and the second output result is generated from a weighted summation of the output signal of the SAR logic circuit after setting the bit to be one of the first logic value and the second logic value; and
adjusting a weighted number corresponding to the bit of the output signal according to the first output result and the second output result;
wherein when the bit of the output signal of the SAR logic circuit is set by the first logic value or the second logic value, a common voltage is provided to a plurality of capacitors of the SAR ADC corresponding to a bit next to the bit on a left hand side to the $n^{th}$ bit of the output signal of the SAR logic circuit.

7. The SAR ADC of claim 2, further comprising:
a capacitor-based digital-to-analog converter (DAC), comprising:
a plurality of capacitors, wherein each capacitor corresponds to each of the at least one bit; and
a plurality of switches, corresponding to the plurality of capacitor.

8. A calibrating method of a successive approximation register (SAR) analog-to-digital converter (ADC), comprising:
generating a first comparison result by comparing an input voltage value of the SAR ADC with a first voltage value and generating a second comparison result by comparing the input voltage value with a second voltage value;
determining whether the SAR ADC enters into a calibration mode with reference to whether the input voltage value of the SAR ADC is between the first voltage value and the second voltage value;
generating an n-bit output signal, wherein n is a positive integer;

when it is determined that the input voltage value is between the first voltage value and the second voltage value, performing a weighted number calibration for each of at least one bit of the n-bit output signal when the input voltage value of the SAR ADC is in the predetermined range, wherein each of the at least one bit of the n-bit output signal corresponds to a weighted number; and when it is determined that the input voltage value is not between the first voltage value and the second voltage value, not performing the weighted number calibration;

wherein the weighted number calibration for each of the at least one bit of the n-bit output signal comprises: adjusting a weighted number corresponding to the bit.

9. The calibrating method of claim 8, wherein the SAR ADC is an n-bit SAR ADC and comprises a SAR logic circuit outputting the n-bit output signal, and $n^{th}$ bit is a most significant bit of the output signal, further comprising:

sequentially and repeatedly performing the weighted number calibration for each of the at least one bit of the n-bit output signal of the SAR logic circuit.

10. The calibrating method of claim 9, wherein the step of adjusting the weighted number corresponding to the bit comprises:

setting the bit of the output signal of the SAR logic circuit to be a first logic value to generate a first output result;

setting the bit of the output signal of the SAR logic circuit to be a second logic value different from the first logic value to generate a second output result, wherein each of the first output result and the second output result is generated from a weighted summation of the output signal of the SAR logic circuit after setting the bit to be one of the first logic value and the second logic value; and adjusting a weighted number corresponding to the bit of the output signal according to the first output result and the second output result;

wherein when the bit of the output signal of the SAR logic circuit is set by the first logic value or the second logic value, a common voltage is provided to a plurality of capacitors of the SAR ADC corresponding to a bit next to the bit on a left hand side to the $n^{th}$ bit of the output signal of the SAR logic circuit.

11. The calibrating method of claim 10, wherein the first output result is generated by setting the bit of the output signal of the SAR logic circuit to be the first logic value in order to sum the weighted summation of the output signal of the SAR logic circuit for a predetermined number of times; and the second output result is generated by setting the bit of the output signal of the SAR logic circuit to be the second logic value in order to sum the weighted summation of the output signal of the SAR logic circuit for a predetermined number of times.

12. The calibrating method of claim 10, wherein the first logic value is logic value 0, and the second logic value is logic value 1; and adjusting the weighted number corresponding to the bit further comprises:

when the first output result is greater than the second output result, adding a predetermined calibrating value to the weighted number corresponding to the bit of the output signal of the SAR logic circuit.

13. The calibrating method of claim 12, wherein the predetermined calibrating value is a quarter of a value corresponding to a least significant bit of the output signal of the SAR ADC or one eighth of the value corresponding to the least significant bit of the output signal of the SAR ADC.

14. The calibrating method of claim 10, wherein the first logic value is logic value 0, and the second logic value is logic value 1; and adjusting the weighted number corresponding to the bit further comprises:

when the first output result is not greater than the second output result, subtracting a predetermined calibrating value from the weighted number corresponding to the bit of the output signal of the SAR logic circuit.

15. The calibrating method of claim 14, wherein the predetermined calibrating value is a quarter of a value corresponding to a least significant bit of the output signal of the SAR ADC or one eighth of the value corresponding to the least significant bit of the output signal of the SAR ADC.

16. An electronic device for calibrating a Successive Approximation Register (SAR) Analog-to-Digital Converter (ADC), comprising:

a storage device, arranged to store a program code; and
a processor, arranged to execute the program code;
wherein when loaded and executed by the processor, the program code instructs the processor to execute the following steps:

determining whether the SAR ADC enters into a calibration mode with reference to whether an input voltage value of the SAR ADC is between a first voltage value and a second voltage value used by a comparing module;

generating an n-bit output signal, wherein n is a positive integer;

when it is determined that the input voltage value is between the first voltage value and the second voltage value, performing a weighted number calibration for each of at least one bit of the n-bit output signal when the input voltage value of the SAR ADC is in the predetermined range, wherein each of the at least one bit of the n-bit output signal corresponds to a weighted number; and when it is determined that the input voltage value is not between the first voltage value and the second voltage value, not performing the weighted number calibration;

wherein the weighted number calibration for each of the at least one bit of the n-bit output signal comprises: adjusting a weighted number corresponding to the bit.

17. The electronic device of claim 16, wherein the SAR ADC is an n-bit SAR ADC and comprises a SAR logic circuit outputting the n-bit output signal, and $n^{th}$ bit is a most significant bit of the n-bit output signal, further comprising:

sequentially and repeatedly performing the weighted number calibration for the at least one bit of the n-bit output signal of the SAR logic circuit.

18. A calibrating method of a Successive Approximation Register (SAR) Analog-to-Digital Converter (ADC), comprising:

determining whether the SAR ADC enters into a calibration mode with reference to whether an input voltage value of the SAR ADC is between a first voltage value and a second voltage value used by a comparing module;

generating an n-bit output signal, wherein n is a positive integer;

when it is determined that the input voltage value is between the first voltage value and the second voltage value, repeatedly performing a weighted number calibration for an $n^{th}$ bit of the n-bit output signal, wherein each bit of the n-bit output signal corresponds to a weighted number, and the $n^{th}$ bit is a most significant bit of the n-bit output signal; and when it is determined that the input voltage value is not between the first voltage value and the second voltage value, not performing the weighted number calibration;

wherein the weighted number calibration for the $n^{th}$ bit of the n-bit output signal of the SAR logic circuit comprises:

adjusting a weighted number corresponding to the $n^{th}$ bit.

19. A successive approximation register (SAR) analog-to-digital converter (ADC) comprising:

a comparing module, arranged to generate a first comparison result by comparing an input voltage value of the SAR ADC with a first voltage value and a second result by comparing the input voltage value with a second voltage value;

a calibration circuit, coupled to the comparing module, for generating a determination result determining whether the input voltage value is in a range according to the first comparison result and the second comparison result, and enters a calibration mode according to the determination result; and a SAR logic circuit, arranged to generate an n-bit output signal, wherein n is a positive integer;

wherein the calibration circuit performs a weighted number calibration for at least one bit of the n-bit output signal of the SAR logic circuit according to the determination result, each of the at least one bit of the n-bit output signal corresponds to a weighted number;

wherein the calibration circuit performs the weighted number calibration to generate at least one calibrating value, and the SAR ADC further comprises:

a digital correction circuit, coupled to the calibration circuit, configured to adjust the weighted number by using the calibrating value to generate an adjusted weighted number, and generate a digital output according to the adjusted weighted number and the n-bit output signal of the SAR logic circuit.

20. The SAR ADC of claim 19, wherein when the determination result indicates that the input voltage value is in the predetermined range, the calibration circuit enters the calibration mode; and when the determination result indicates that the input voltage value is not within the predetermined range, the calibration circuit stays in a normal mode.

21. A successive approximation register (SAR) analog-to-digital converter (ADC) comprising:

a comparing module, arranged to generate a first comparison result by comparing an input voltage value of the SAR ADC with a first voltage value and a second result by comparing the input voltage value with a second voltage value;

a calibration circuit, coupled to the comparing module, for generating a determination result determining whether the input voltage value is in a range according to the first comparison result and the second comparison result, and enters a calibration mode according to the determination result; and a SAR logic circuit, arranged to generate an n-bit output signal, wherein n is a positive integer;

wherein the calibration circuit performs a weighted number calibration for at least one bit of the n-bit output signal of the SAR logic circuit according to the determination result, and the calibration circuit adjusts the weighted number corresponding to the bit comprises:

setting the bit of the output signal of the SAR logic circuit to be a first logic value in order to generate a first output result;

setting the bit of the output signal of the SAR logic circuit to be a second logic value different from the first logic value in order to generate a second output result, wherein each of the first output result and the second output result is generated from a weighted summation of the output signal of the SAR logic circuit after setting the bit to be one of the first logic value and the second logic value; and adjusting a weighted number corresponding to the bit of the output signal according to the first output result and the second output result;

wherein when the bit of the output signal of the SAR logic circuit is set by the first logic value or the second logic value, a common voltage is provided to a plurality of capacitors of the SAR ADC corresponding to a bit next to the bit on a left hand side to the $n^{th}$ bit of the output signal of the SAR logic circuit.

22. The SAR ADC of claim 21, wherein when the determination result indicates that the input voltage value is in the predetermined range, the calibration circuit enters the calibration mode; and when the determination result indicates that the input voltage value is not within the predetermined range, the calibration circuit stays in a normal mode.

* * * * *